United States Patent
Chiu

(10) Patent No.: US 8,598,004 B2
(45) Date of Patent: Dec. 3, 2013

(54) SELF ALIGNED MOS STRUCTURE WITH POLYSILICON CONTACT

(75) Inventor: Tzu Yin Chiu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 458 days.

(21) Appl. No.: 12/258,371

(22) Filed: Oct. 24, 2008

(65) Prior Publication Data

US 2010/0001354 A1  Jan. 7, 2010

(30) Foreign Application Priority Data

Jul. 2, 2008 (CN) .......................... 2008 1 0040290

(51) Int. Cl.
*H01L 21/336* (2006.01)

(52) U.S. Cl.
USPC ........... 438/301; 438/238; 438/382; 257/383; 257/413

(58) Field of Classification Search
USPC .................... 257/383, 756, 757, 758, E27.05, 257/E21.64; 438/238, 381, 382, 558, 597, 438/637
See application file for complete search history.

(56) References Cited

U.S. PATENT DOCUMENTS

| | | | |
|---|---|---|---|
| 4,784,971 A | 11/1988 | Chiu et al. | |
| 4,884,796 A | 12/1989 | Daboub | |
| 4,979,010 A * | 12/1990 | Brighton | 257/518 |
| 4,980,304 A | 12/1990 | Chin et al. | |
| 4,992,848 A | 2/1991 | Chin et al. | |
| 4,994,402 A * | 2/1991 | Chiu | 438/297 |
| 5,106,783 A | 4/1992 | Chin et al. | |
| 5,340,774 A * | 8/1994 | Yen | 438/301 |
| 5,462,888 A | 10/1995 | Chiu et al. | |
| 5,541,434 A * | 7/1996 | Nicholls et al. | 257/383 |
| 5,668,051 A * | 9/1997 | Chen et al. | 438/558 |
| 5,827,764 A * | 10/1998 | Liaw et al. | 438/238 |
| 5,858,848 A * | 1/1999 | Gardner et al. | 438/305 |
| 5,994,735 A * | 11/1999 | Maeda et al. | 257/329 |
| 6,074,923 A * | 6/2000 | Lee | 438/305 |
| 6,153,527 A * | 11/2000 | Jost et al. | 438/696 |
| 6,177,304 B1 * | 1/2001 | Li et al. | 438/233 |
| 6,310,397 B1 * | 10/2001 | Chang et al. | 257/756 |
| 6,657,223 B1 * | 12/2003 | Wang et al. | 257/19 |

(Continued)

*Primary Examiner* — Phuc Dang
(74) *Attorney, Agent, or Firm* — Kilpatrick Townsend and Stockton LLP

(57) ABSTRACT

A method for fabricating a semiconductor integrated circuit and resulting structure. The method includes providing a semiconductor substrate with an overlying dielectric layer and forming a polysilicon gate layer and an overlying capping layer. The gate layer is overlying the dielectric layer. The method also includes patterning the polysilicon gate layer to form a gate structure and a local interconnect structure. The gate structure and the local interconnect structure include a contact region defined therebetween. The gate structure also includes the overlying capping layer. The method includes forming sidewall spacers on the gate structure and the local interconnect structure and removing the sidewall spacer on the local interconnect structure. The method also includes forming contact polysilicon on the contact region and implanting a dopant impurity into the contact polysilicon. The method diffuses the dopant impurity from the contact polysilicon into the contact region in the substrate to form a diffused junction region. The method selectively removes the capping layer overlying the gate structure. The method then forms a silicide layer overlying the gate structure and surface of the contact polysilicon, whereupon the sidewall spacers isolate the silicide layer on the gate structure from the silicide layer on the contact polysilicon.

12 Claims, 4 Drawing Sheets

(56) References Cited

U.S. PATENT DOCUMENTS

| | | | |
|---|---|---|---|
| 6,724,085 B2 * | 4/2004 | Tomita | 257/758 |
| 7,045,848 B2 * | 5/2006 | Shukuri | 257/311 |
| 7,176,125 B2 * | 2/2007 | Liaw | 438/637 |

* cited by examiner

SELF ALIGNED MOS STRUCTURE WITH POLYSILICON CONTACT

CROSS-REFERENCE TO RELATED APPLICATIONS

This application claims priority to Chinese Patent Application No. 200810040290.7, filed Jul. 2, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a method and device for manufacturing a smaller contact structure for a cell of a MOS transistor device. Merely by way of example, the invention has been applied to a standard MOS transistor device for integrated circuits. But it would be recognized that the invention can be applied to a variety of applications such as memories, application specific integrated circuits, microprocessors, any combination of these, and the like.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to reduce a cell size of a semiconductor device in a cost efficient and efficient way.

Various techniques have been used to reduce the cell size of semiconductor devices. An example of such techniques includes the use of sidewall spacers on edges of metal oxide silicon (MOS) gate structures. Such sidewall spacers are used to form a self-aligned contact region, which is smaller in size and more efficient to manufacture. Other techniques use increasing smaller gate structure, shallower implanting techniques, among others. Unfortunately, many limitations exist with the convention semiconductor devices. Often times, it is difficult to reduce a cell size less than 70 nanometers of a critical dimension of the gate structure. The reduced cell size is based upon practical limits of processes and equipment used for the manufacture of semiconductor devices. These and other limitations are described throughout the present specification and more particularly below.

From the above, it is seen that an improved technique for processing semiconductor devices is desired.

BRIEF SUMMARY OF THE INVENTION

According to the present invention, techniques including methods for the manufacture of semiconductor devices are provided. More particularly, the invention provides a method and device for manufacturing a smaller contact structure for a cell of a MOS transistor device. Merely by way of example, the invention has been applied to a standard MOS transistor device for integrated circuits. But it would be recognized that the invention can be applied to a variety of applications such as memories, application specific integrated circuits, microprocessors, any combination of these, and the like.

In a specific embodiment, the invention provides a method for fabricating a semiconductor integrated circuit. The method includes providing a semiconductor substrate (e.g., silicon wafer) with an overlying dielectric layer (e.g., gate oxide, silicon oxynitride, nitride). The method also includes forming a polysilicon gate layer and an overlying capping layer, e.g., undoped polysilicon, silicon nitride. The gate layer is overlying the dielectric layer, which serves as a gate dielectric for an MOS transistor. The method also includes patterning the polysilicon gate layer to form a gate structure and a local interconnect structure. Preferably, patterning occurs using masking and etching techniques. The gate structure and the local interconnect structure include a contact region defined therebetween. The contact region is an exposed substrate region for source/drain structures for the MOS transistor. The gate structure also includes the overlying capping layer and the local interconnect structure may also have the overlying capping layer. The method includes forming sidewall spacers on the gate structure and the local interconnect structure. The sidewall spacer are removed on the local interconnect structure, but remain on the gate structure. The method also includes forming contact polysilicon on the contact region and implanting a dopant impurity into the contact polysilicon. The method diffuses the dopant impurity from the contact polysilicon into the contact region in the substrate to form a diffused junction region. The method selectively removes the capping layer overlying the gate structure. The method then forms a silicide layer overlying the gate structure and surface of the contact polysilicon, whereupon the sidewall spacers isolate the silicide layer on the gate structure from the silicide layer on the contact polysilicon.

In an alternative specific embodiment, the invention provides an integrated circuit structure. The structure has a substrate comprising a well region and a surface region. An isolation region is formed within the well region of the substrate. A gate insulating layer is formed overlying the surface region of the substrate. A first source/drain region and a second source drain region are formed within the well region of the substrate. The structure also has a channel region formed between the first source/drain region and the second source/drain region within the well region of substrate and formed within a vicinity of the gate insulating layer. A gate layer is overlying the gate insulating layer and coupled to the channel region. The structure has sidewall spacers formed on edges of the gate layer to isolate the gate layer. A local interconnect layer is formed overlying the surface region of the substrate. The local interconnect layer has an edge region extending within a vicinity of the first source/drain region. A contact layer is formed on the first source/drain region and is contacting the edge region of the local interconnect layer. The contact layer also has a portion abutting a portion of the sidewall spacers. A first silicide layer is formed overlying the contact layer and local interconnect layer and a second silicide layer is formed overlying the gate layer. A diffusion region extends from the first source/drain region through the contact layer to a portion of the first interconnect layer.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides a self-aligned MOS transistor structure that can lead to smaller transistor cell sizes. That is, the entire cell size may be less than three times the minimum size (e.g., design rule) of the transistor gate dimension (e.g., 0.25 micron, 0.18 micron, 0.13 micron and less) in certain embodiments. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
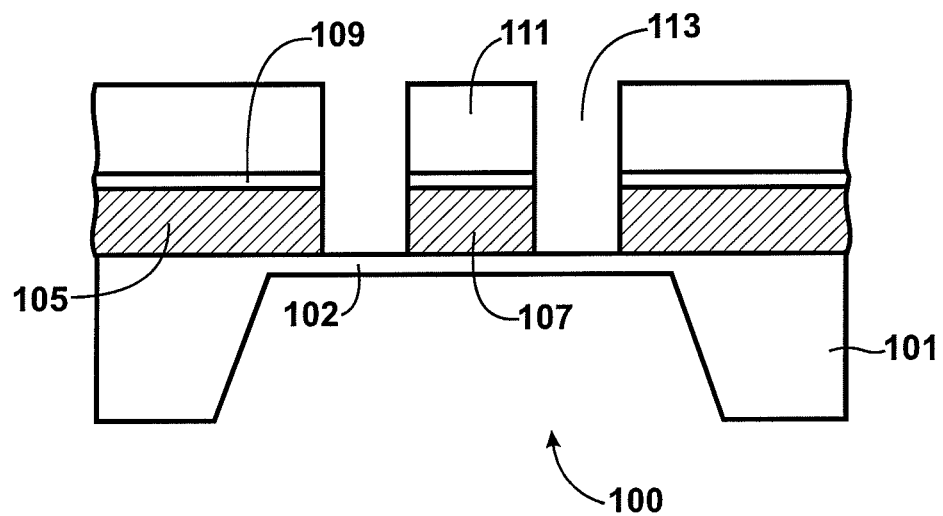
FIGS. 1 through 6 are simplified side-view diagram illustrating a method for fabricating a self aligned MOS structure according to an embodiment of the present invention.

According to the present invention, techniques including methods for the manufacture of semiconductor devices are provided. More particularly, the invention provides a method and device for manufacturing a smaller contact structure for a cell of a MOS transistor device. Merely by way of example, the invention has been applied to a standard MOS transistor device for integrated circuits. But it would be recognized that the invention can be applied to a variety of applications such as memories, application specific integrated circuits, microprocessors, any combination of these, and the like.

A method according to an embodiment of the present invention can be briefly provided as follows:

1. Provide a semiconductor substrate with an overlying dielectric layer;
2. Form a polysilicon gate layer and an overlying capping layer;
3. Pattern the polysilicon gate layer to form a gate structure and a local interconnect structure;
4. Define a contact region between the gate structure and the local interconnect structure;
5. Form sidewall spacers on the gate structure and the local interconnect structure;
6. Remove the sidewall spacer on the local interconnect structure;
7. Form a contact polysilicon on the contact region;
8. Implant a dopant impurity into the contact polysilicon;
9. Diffuse the dopant impurity from the contact polysilicon into the contact region in the substrate to form a diffused junction region;
10. Selectively remove the capping layer overlying the gate structure;
11. Form a silicide layer overlying the gate structure and surface of the contact polysilicon while the sidewall spacers on the gate structure isolate the silicide layer on the gate structure from the silicide layer on the contact polysilicon; and
12. Perform other steps, as desired.

The above sequence of steps provides a method according to an embodiment of the present invention. Other alternatives can also be provided where steps are added, one or more steps are removed, or one or more steps are provided in a different sequence without departing from the scope of the claims herein. The present method provides a self-aligned MOS structure that can be used for form a smaller cell region than conventional MOS structures. Further details of the present method can be found throughout the present specification and more particularly below.

FIGS. 1 through 6 are simplified side-view diagram illustrating a method for fabricating a self aligned MOS structure according to an embodiment of the present invention. These diagrams are merely examples, which should not unduly limit the scope of the claims herein. One of ordinary skill in the art would recognize many variations, alternatives, and modifications. As shown, the method begins by providing a semiconductor substrate 100. Preferably, the substrate is a silicon wafer, a silicon on insulator wafer, or an epitaxial wafer. The method includes forming an overlying dielectric layer 102 that defines a gate dielectric layer. Preferably, the dielectric layer is a gate oxide layer, but can also be a gate nitride or silicon oxynitride and the like. The method forms a polysilicon gate layer and an overlying capping layer 109. The capping layer can be a variety of materials such as undoped polysilicon, silicon dioxide, silicon nitride, and others, which serve as a hard mask. The gate layer is overlying the dielectric layer 102, as shown, for an MOS transistor.

The method also includes patterning the polysilicon gate layer to form a gate structure 107 and a local interconnect structure 105. Patterning often occurs using photolithography and etching techniques. The gate structure and the local interconnect structure include a contact region 113 defined therebetween. The local interconnect structure and gate structure are formed within the same layer as shown. The contact region is an exposed portion of the substrate. The exposed portion corresponds to source/drain regions of an MOS transistor. As shown, the gate structure also includes the overlying capping layer. A photomask 111 is provided to define the gate structure and the local interconnect structure. A shallow trench isolation region 101 is also formed in the substrate using conventional techniques. Often times, the shallow trench isolation is made using a combination of etching and deposition techniques known in the art. Other types of isolation can also be used such as LOCOS and the like.

Figure 2:
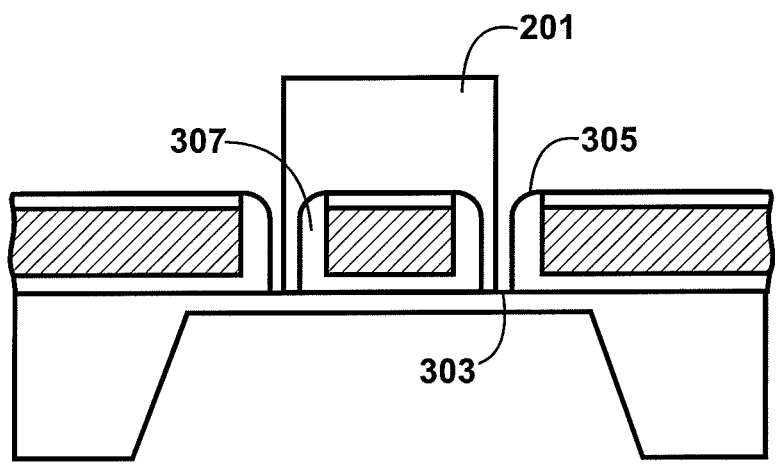
Figure 2A:
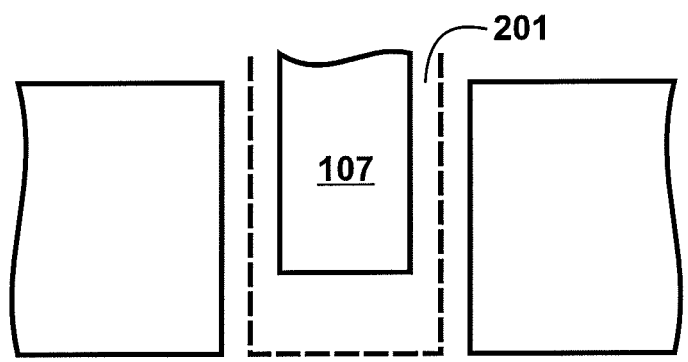
FIG. 2A is a simplified top-view diagram of the structure in FIG. 2.

Referring to FIG. 2, the method includes forming sidewall spacers on the gate structure and the local interconnect structure. The sidewall spacers are formed by depositing an insulating layer overlying surfaces of the gate structure and the local interconnect structure. The insulating layer is etched using an anisotropic etching process, such as plasma etching, reactive ion etching, or any of these techniques. Such etching progress removes horizontal portions of the insulating layer while leaving vertical portions intact. These vertical portions are formed on edges of the gate structure and local interconnect structure, as shown. Depending upon the embodiment, the insulating layer can be a single layer or multiple layers of similar or different materials. A photoresist film 201 is applied to the gate structure to cover the gate structure including the sidewall spacers 307. The photoresist film even covers a portion of the contact region and leaves a portion 303 exposed. A top-view diagram of the photoresist film as applied to the gate and interconnect structures is illustrated by way of FIG. 2A. As shown, the photoresist film covers the gate structure including the sidewall spacers and a portion of the contact region. The photoresist film leaves the sidewall spacers 305 on the local interconnect structure free and exposed. An etching process is performed to selectively remove the sidewall spacers on edges of the local interconnect structure. Other techniques may also be used to selectively remove only the spacers on the interconnect structure while maintaining the sidewall spacers on the gate structure.

Figure 3:
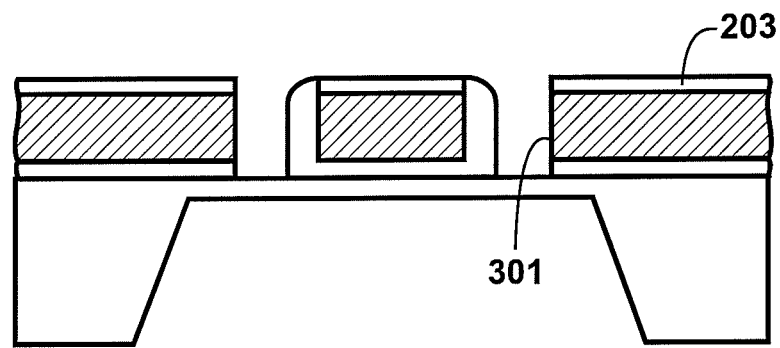
Figure 4:
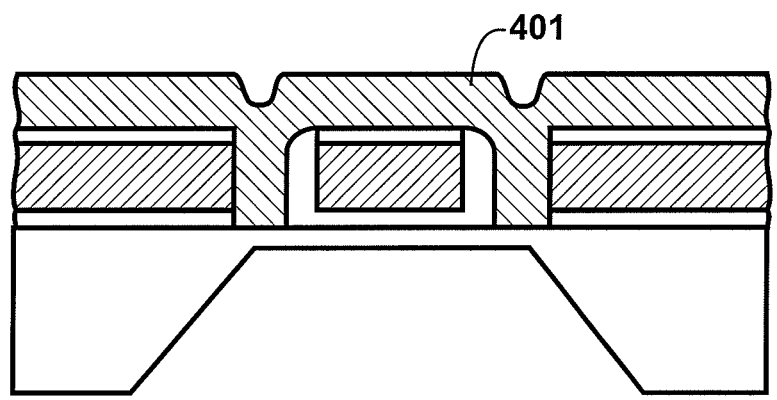

Referring to FIG. 3, the method strips the photoresist film while exposing the contact region and capping layer. As also shown, edges 301 of the local interconnect structure are exposed. Edges of the gate structure include sidewall spacers. Capping layer 203 acts as a hard mask. The method then includes forming contact polysilicon 401 on the contact region and overlying the gate structure and local interconnect structure, as illustrated by FIG. 4. The contact polysilicon is provided using a blanket layer. The method introduces impurities into the contact polysilicon. Here, the method implants a dopant impurity into the contact polysilicon. Other forms of introducing impurities such as in-situ doping techniques, diffusion, and others may also be used. The doped polysilicon is to be conductive. The method then diffuses the dopant impurity from the contact polysilicon into the contact region in the substrate to form a diffused junction region within the substrate.

Figure 5:
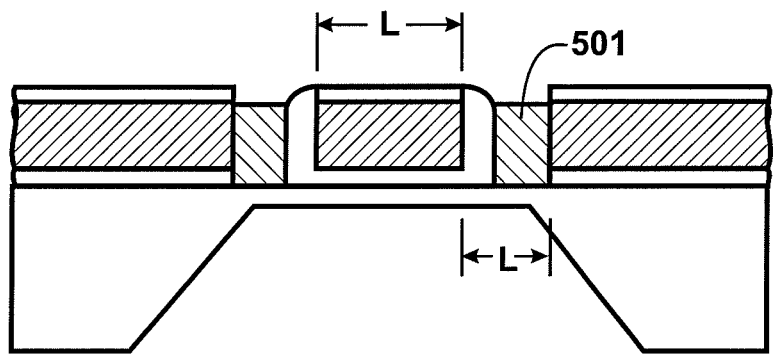
Figure 6:
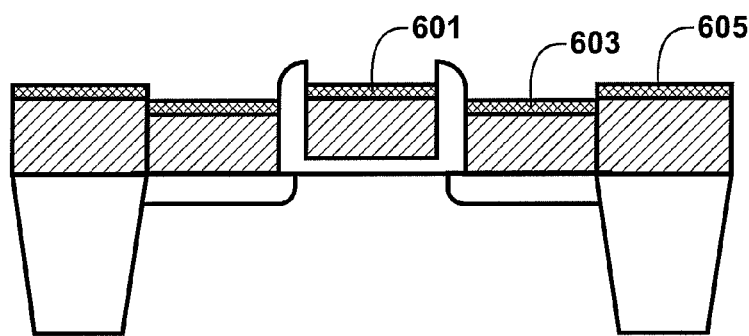

The method removes the contact polysilicon using reactive ion etching and/or chemical mechanical planarization, as illustrated by FIG. 5. Alternatively, certain combinations of etching and chemical mechanical planarization may also be used. Here, the contact polysilicon 501 remains in the contact region, which connects the contact polysilicon from the contact region to the local interconnect structure. The gate structure remains isolated from the contact polysilicon via the sidewall spacers. The method selectively removes the capping layer overlying the gate structure. Here, the sidewall spacers extend above a surface region of the gate structure. The method then forms a silicide layer 601 overlying the gate structure and a silicide layer 603, 605 overlying the surface of the contact polysilicon and local interconnect structure, as illustrated by FIG. 6. The sidewall spacers isolate the silicide layer on the gate structure from the silicide layer on the contact polysilicon. As shown, the silicide selectively adheres to the gate structure and the interconnect structure but does not attach to the spacer structures. The silicide may include nickel silicide, cobalt silicide, titanium silicide, platinum silicide, tantalum silicide, and others. Depending upon the embodiment, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a semiconductor integrated circuit, the method comprising:
   providing a semiconductor substrate;
   forming a dielectric layer overlying the semiconductor substrate;
   forming a polysilicon gate layer overlying the dielectric layer;
   forming a capping layer overlying the polysilicon gate layer;
   patterning the polysilicon gate layer and the capping layer to form a gate structure, a local interconnect structure, and a contact region, the contact region being defined between the gate structure and the local interconnect structure, the gate structure and the local interconnect structure including the polysilicon gate layer and the overlying capping layer;
   forming sidewall spacers on the gate structure and the local interconnect structure;
   covering the gate structure including the sidewalls and a portion of the contact region with a photoresist layer while leaving the local interconnect structure totally uncovered;
   removing the sidewall spacer on the local interconnect structure;
   forming a contact polysilicon on the contact region;
   implanting a dopant impurity into the contact polysilicon;
   diffusing the dopant impurity from the contact polysilicon into the contact region in the substrate to form a diffused junction region;
   selectively removing the capping layer overlying the gate structure; and
   forming a silicide layer overlying the gate structure and a surface of the contact polysilicon, whereupon the sidewall spacers isolate the silicide layer on the gate structure from the silicide layer on the contact polysilicon.

2. The method of claim 1 wherein the contact region is a minimum lithographic dimension.

3. The method of claim 1 wherein the forming of the contact polysilicon comprising:
   depositing a blanket layer of polysilicon overlying the contact region, the gate structure, and the local interconnect structure;
   removing portions of the blanket layer to expose the gate structure and the local interconnect structure; and
   removing portions of the blanket layer to isolate the contact region from other contact regions.

4. The method of claim 3 wherein the removing is provided by chemical mechanical polishing and/or etchback.

5. The method of claim 1 wherein the diffused junction region is a source/drain region.

6. The method of claim 1 wherein the diffused junction region and the contact polysilicon becomes a source/drain region.

7. The method of claim 1 wherein the contact polysilicon has a substantially even thickness across a length of the contact polysilicon.

8. The method of claim 1 wherein the gate structure is provided in a cell, the cell being less than three times a minimum lithographic dimension.

9. The method of claim 1 wherein the selectively removing the capping layer overlying the gate structure exposes an upper portion of the sidewall spacers, whereupon the upper portion of the sidewall spacers is free from contact with either the contact polysilicon or the gate structure.

10. The method of claim 1 wherein the removing portions of the blanket layer to isolate the contact region from other contact regions comprising:
    forming a masking layer overlying at least the gate structure and contact region; and
    removing the portions of the blanket layer to isolate the contact region from the other contact regions.

11. The method of claim 1 wherein the silicide layer is selected from nickel silicide, titanium silicide, cobalt silicide, platinum silicide, or tantalum silicide.

12. The method of claim 1 wherein the gate structure and the local interconnect structure are substantially coplanar.

* * * * *